United States Patent
Kim et al.

(10) Patent No.: US 10,068,324 B2
(45) Date of Patent: Sep. 4, 2018

(54) 3D PROFILING SYSTEM OF SEMICONDUCTOR CHIP AND METHOD FOR OPERATING THE SAME

(71) Applicant: Samsung Electronics Co., Ltd., Suwon-si (KR)

(72) Inventors: Jung Soo Kim, Hwaseong-si (KR); Jin Kwan Kim, Seongnam-si (KR); Chung Sam Jun, Suwon-si (KR); Yu sin Yang, Seoul (KR); Soo Seok Lee, Hwaseong-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 34 days.

(21) Appl. No.: 15/291,590

(22) Filed: Oct. 12, 2016

(65) Prior Publication Data

US 2017/0169558 A1    Jun. 15, 2017

(30) Foreign Application Priority Data

Dec. 7, 2015    (KR) .......................... 10-2015-0173302

(51) Int. Cl.
 *G06T 7/00* (2017.01)
 *G06T 7/50* (2017.01)
 (Continued)

(52) U.S. Cl.
 CPC ........... *G06T 7/0004* (2013.01); *G01Q 30/02* (2013.01); *G06K 9/4604* (2013.01); *G06T 7/41* (2017.01);
 (Continued)

(58) Field of Classification Search
 CPC ......... G06T 7/0004; G06T 7/41; G06T 7/529; G06T 7/50; G06T 2207/10061;
 (Continued)

(56) References Cited

U.S. PATENT DOCUMENTS

| 4,506,296 A | 3/1985 | Marraud et al. |
| 5,594,245 A | 1/1997 | Todokoro et al. |

(Continued)

FOREIGN PATENT DOCUMENTS

| EP | 2444991 | 4/2012 |
| JP | 2011-233523 | 11/2011 |

(Continued)

*Primary Examiner* — Ming Hon
(74) *Attorney, Agent, or Firm* — Muir Patent Law, PLLC

(57) ABSTRACT

A 3D profiling system of a semiconductor chip is provided and includes a storage unit that receives scanning electron microscope (SEM) images of a plurality of semiconductor devices having respective data with respect to a plurality of different components and gray levels of each SEM image. An extraction unit that performs principal component analysis (PCA) on the gray level of the SEM image and separates principal components from among the plurality of different components is also part of the system. Additionally, a calculation unit receives provision of actually measured values of the plurality of semiconductor devices, and applies a multiple linear regression to the principal components based on the measured values to complete a 3D profile of the semiconductor chip.

20 Claims, 17 Drawing Sheets

(51) Int. Cl.
*G06K 9/46* (2006.01)
*G01Q 30/02* (2010.01)
*H01J 37/28* (2006.01)
*G06T 7/529* (2017.01)
*G06T 7/41* (2017.01)

(52) U.S. Cl.
CPC ................ *G06T 7/50* (2017.01); *G06T 7/529* (2017.01); *H01J 37/28* (2013.01); *G06T 2207/10028* (2013.01); *G06T 2207/10061* (2013.01); *G06T 2207/30148* (2013.01); *H01J 2237/225* (2013.01); *H01J 2237/281* (2013.01)

(58) Field of Classification Search
CPC .......... G06T 2207/30148; G06T 2207/10028; G06K 9/4604; G01Q 30/02; H01J 37/28; H01J 2237/281; H01J 2237/225
See application file for complete search history.

(56) References Cited

U.S. PATENT DOCUMENTS

| | | | |
|---|---|---|---|
| 6,930,308 B1 | 8/2005 | Lorusso et al. | |
| 6,934,406 B1* | 8/2005 | Nakano | G06K 9/00228 382/118 |
| 7,483,560 B2 | 1/2009 | Shishido et al. | |
| 7,705,304 B2 | 4/2010 | Kawamata et al. | |
| 7,816,062 B2 | 10/2010 | Nagatomo et al. | |
| 7,935,927 B2 | 5/2011 | Miyamoto et al. | |
| 8,178,838 B2 | 5/2012 | Principe | |
| 8,192,922 B2 | 6/2012 | Cheng | |
| 8,232,523 B2 | 7/2012 | Boughorbel et al. | |
| 8,597,656 B2 | 12/2013 | Silva et al. | |
| 8,604,427 B2 | 12/2013 | Schwarzband et al. | |
| 2005/0133718 A1* | 6/2005 | Miyamoto | G01B 15/04 250/307 |
| 2005/0285034 A1* | 12/2005 | Tanaka | H01J 37/28 250/310 |
| 2016/0025618 A1* | 1/2016 | Ryu | G01N 21/211 356/369 |
| 2016/0163035 A1* | 6/2016 | Chang | G06K 9/4628 382/149 |

FOREIGN PATENT DOCUMENTS

| | | |
|---|---|---|
| JP | 2014-052379 | 3/2014 |
| KR | 2011-0003526 | 1/2011 |
| KR | 1381300 | 4/2014 |

* cited by examiner

1200

1300

1400

US 10,068,324 B2

3D PROFILING SYSTEM OF SEMICONDUCTOR CHIP AND METHOD FOR OPERATING THE SAME

This application claims priority from Korean Patent Application No. 10-2015-0173302 filed on Dec. 7, 2015 in the Korean Intellectual Property Office, the disclosure of which is incorporated herein by reference in its entirety.

BACKGROUND

1. Technical Field

The exemplary implementations of the herein described subject matter relate to a 3D profiling system of a semiconductor chip and a method for operating the same.

2. Description of the Related Art

With the ever increasing miniaturization of semiconductor chips, the process margin in forming fine patterns is continuously decreasing. The process margin for the etching depth of the fine pattern as well as the process margin for the pitch dimension of the fine pattern also decrease. Therefore, there are needs for a technique for precisely measuring a three-dimensional depth for measuring the etching depth of the fine pattern as well as a technique for measuring a two-dimensional critical dimension (CD) for measuring the pitch of the fine pattern.

For the structural analysis of various types of fine patterns formed in semiconductor chips, a non-destructive method using a scanning electron microscopy (SEM) has been used. However, since images obtained using the SEM are basically 2D images, to obtain three-dimensional information of the structure typically requires a destructive structural analysis method.

SUMMARY

An aspect of the exemplary implementations of the herein described subject matter provides a system capable of obtaining 3D profile information regarding a semiconductor chip, the semiconductor devices that make up the chip and the components of the semiconductor devices, using a SEM image and gray level information thereof.

Another aspect of the present exemplary implementations provides a method for operating a system capable of obtaining 3D profile information of the semiconductor devices, using a SEM image and gray level information thereof.

However, aspects of the present exemplary implementations are not restricted to the ones set forth herein. The above and other aspects of the present exemplary implementations that have not been mentioned will become more apparent to one of ordinary skill in the art to which the present inventive concepts pertain by referencing the detailed description of the present exemplary implementations given below.

According to an aspect of the present exemplary implementations, a 3D profiling system of a semiconductor chip includes a storage unit that receives scanning electron microscope (SEM) image of a plurality of semiconductor devices on the chip having respective data with respect to a plurality of different components of the semiconductor devices and a gray level of the SEM image, an extraction unit that performs principal component analysis (PCA) on the gray level of the SEM image and separates principal components among the plurality of different components, and a calculation unit that receives provision of actually measured values of the plurality of semiconductor devices, and applies a multiple linear regression to the principal components based on the measured values to complete a 3D profile of the semiconductor chip.

According to another aspect of the present exemplary implementations, a 3D profiling system of a semiconductor chip includes an electron irradiation unit that irradiates an electron beam toward semiconductor devices on the chip having respective data for a plurality of different components of the semiconductor devices, a stage that supports the semiconductor chip, a detecting unit that detects intensity of the electrons emitted from the semiconductor devices to generate a gray level of an SEM image, an extraction unit that performs PCA on the gray level of the SEM image to separate the principal components among the plurality of different components, and a calculation unit that receives provision of actually measured values of the plurality of components, and applies a multiple linear regression to the principal components based on the actually measured values to complete a 3D profile of the semiconductor chip.

BRIEF DESCRIPTION OF THE DRAWINGS

The above and other aspects and features of the present exemplary implementations will become more apparent by describing in detail exemplary implementations with reference to the attached drawings, in which:

FIG. 8 is a block diagram of the 3D profiling system of the semiconductor chip according to another exemplary implementation of;

DETAILED DESCRIPTION

Figure 1:
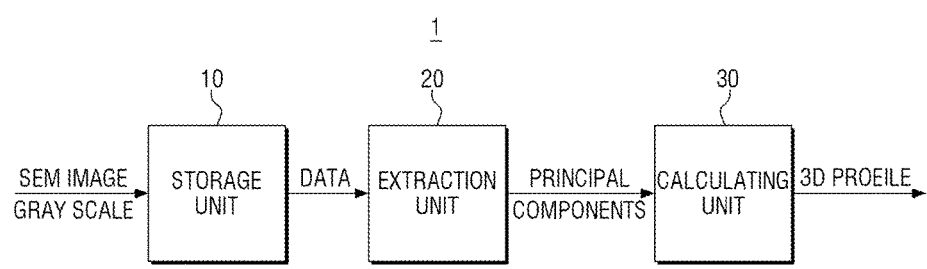
FIG. 1 is a block diagram of a 3D profiling system of a semiconductor chip in an exemplary implementation of the herein described subject mater.

The present disclosure now will be described more fully hereinafter with reference to the accompanying drawings, in which various exemplary implementations are shown. The invention may, however, be embodied in many different forms and should not be construed as limited to the example exemplary implementations set forth herein. These example exemplary implementations are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram of a 3D profiling system of a semiconductor chip in an exemplary implementation.

As shown in FIG. 1, a 3D profiling system 1 of a semiconductor chip includes a storage unit 10, an extraction unit 20 and a calculation unit 30.

The storage unit 10 may receive an image of the semiconductor chip captured using a SEM. Alternatively, the storage unit 10 may receive a gray level of the SEM image analyzed by a detector.

The gray level acquired by the SEM may represent the intensity of electrons emitted from the semiconductor chip. For example, the storage unit 10 may receive an input indicative of the amount or speed of the secondary electrons reflected or scattered from the semiconductor chip.

The semiconductor chip measured by the SEM image or the gray level may have a plurality of different semiconductor devices each made up of a plurality of different components having defined characteristics, and data.

The characteristics of the semiconductor device may be defined by the characteristics of the plurality of components such as, for example, the height of the device, a top critical dimension (TCD), a bottom critical dimension (BCD) and profiles of the side walls.

Further, the plurality of different semiconductor devices may have differing data measured with respect to the components. The image or the gray level of each semiconductor device acquired by the SEM contains such information, and the data may be distributed, while forming a constant correlation with the intensity of the gray level.

The extraction unit 20 receives the gray level of the SEM image from the storage unit 10, and may perform principal component analysis (PCA) with respect to the gray level. As a result of the PCA, from among the plurality of different components, the principal components of the gray level of the semiconductor device may be extracted.

If the n principal components among the different m components are extracted as the PCA result, the gray level of the semiconductor chip may be expressed by n-dimensional data.

The calculation unit 30 receives the extracted principal components from the extraction unit 20, receives the actually measured values for each of the semiconductor devices to apply multiple linear regression analysis to the principal components based on the actually measured values, and may form a relational formula of the gray levels and the principal components.

The actually measured value of the semiconductor chip may be measured by a transmission electron microscopy (TEM), an X-SEM and/or an atomic force microscope (AFM) of the semiconductor chip.

Figure 2:
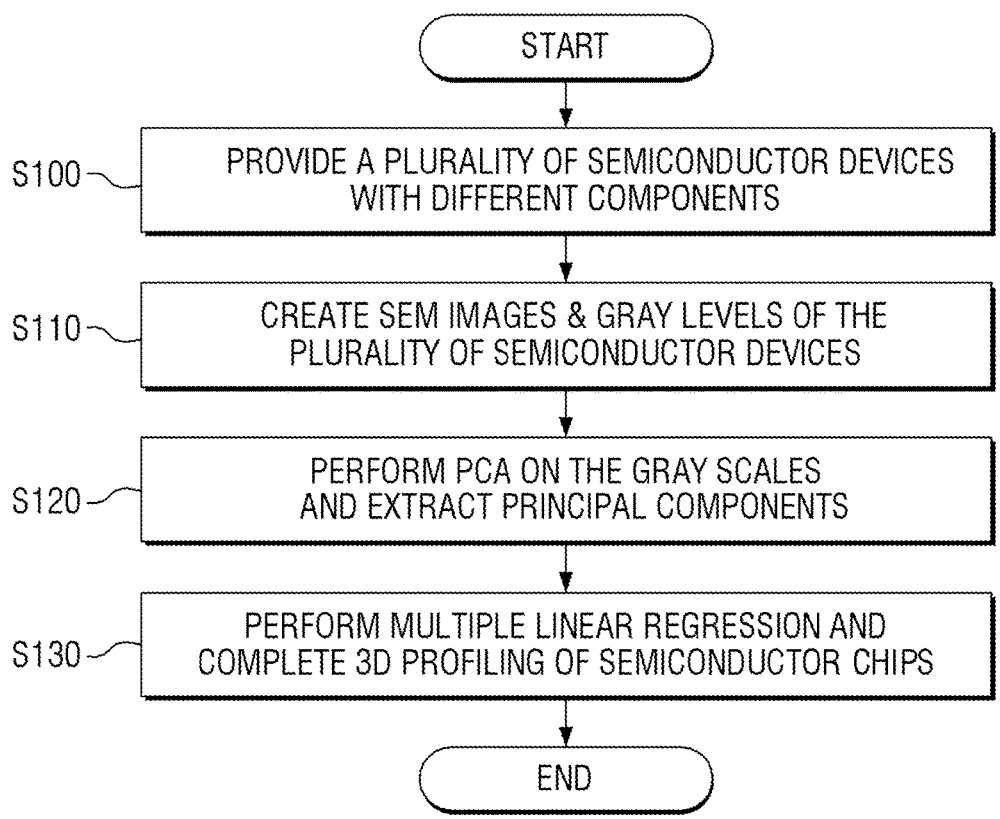
FIG. 2 is a flowchart for explaining the operation of the system of FIG. 1.

FIG. 2 is a flowchart for explaining the operation of the system of FIG. 1.

As shown in FIG. 2, the 3D profiling method of the semiconductor chip according to the exemplary implementation provides in (S100) a plurality of semiconductor devices having respective data for a plurality of different components. Next in (S110) SEM images and the gray levels of the SEM images for the plurality of semiconductor devices are generated. In (S120) the principal components are extracted by performing PCA on the gray levels associated with each semiconductor device. In (S130) the 3D profile of the semiconductor chip is completed by applying multiple linear regression to the principle components.

Figure 3A:
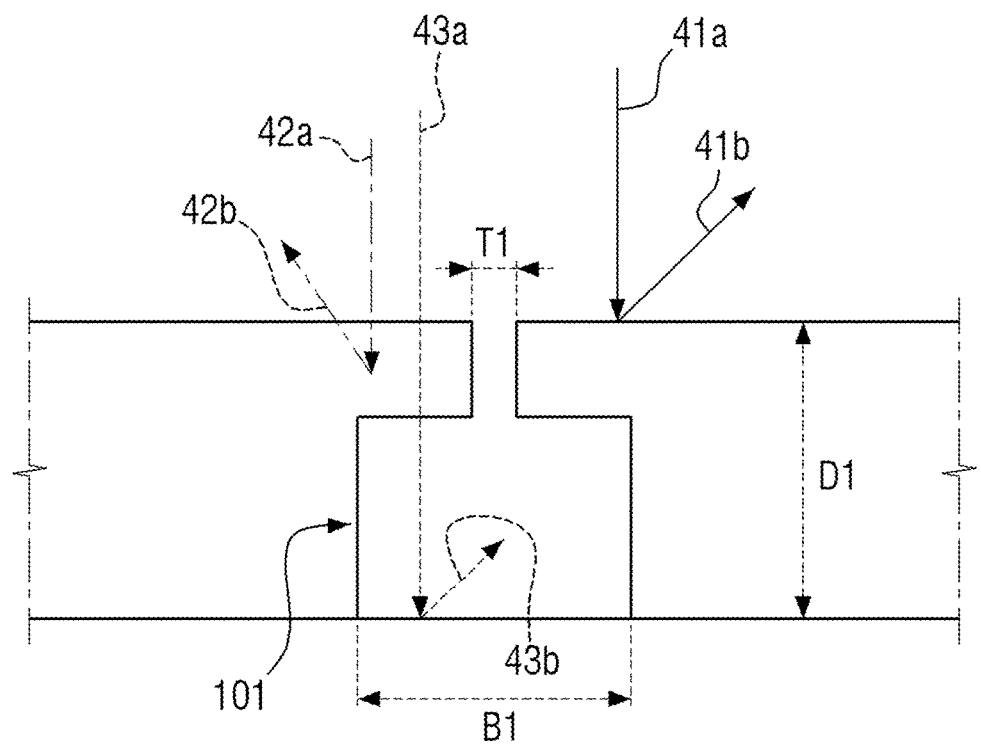
FIGS. 3A to 3C are cross-sectional views of the semiconductor chip as a measurement target of the system according to the exemplary implementation.
Figure 3B:
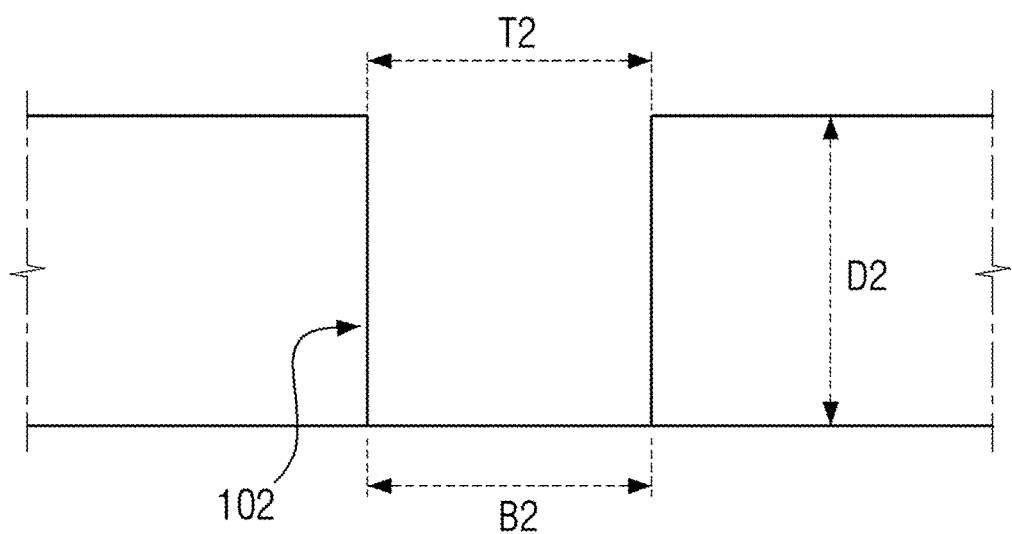
Figure 3C:
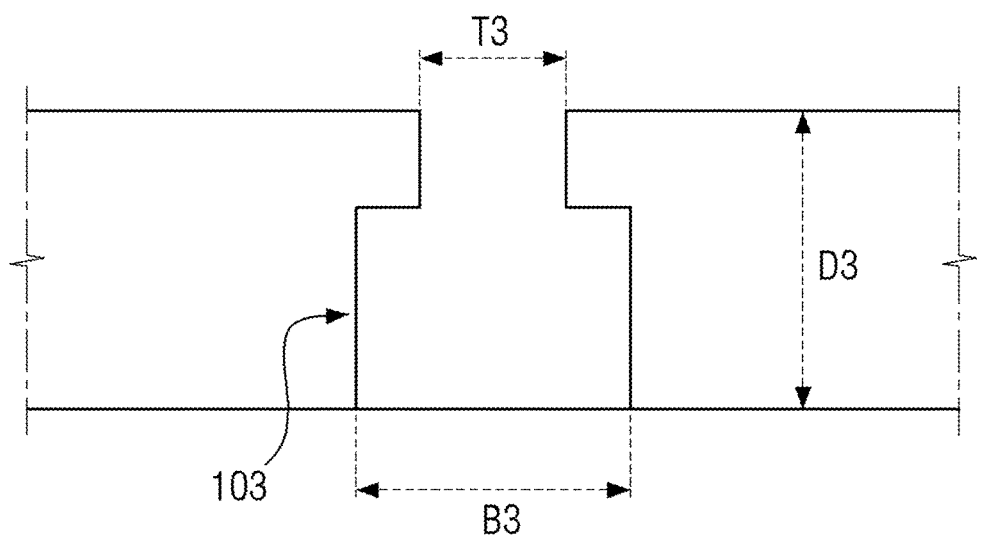
Figure 4A:
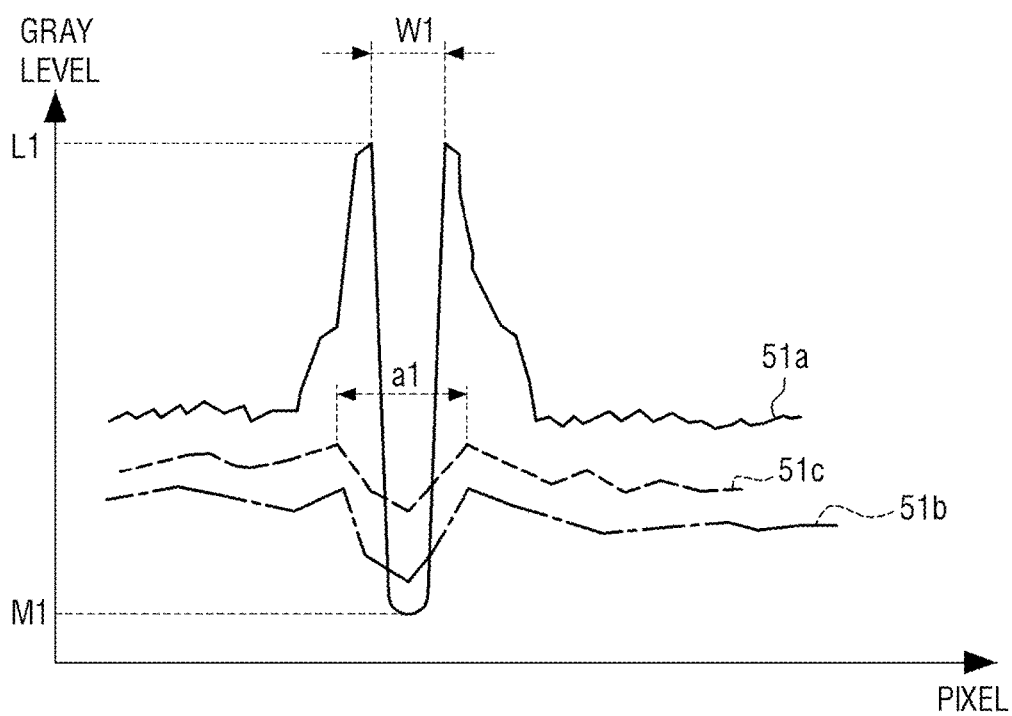
FIGS. 4A to 4C are graphs illustrating a gray level of the SEM image of the semiconductor chip of FIGS. 3A to 3C.
Figure 4B:
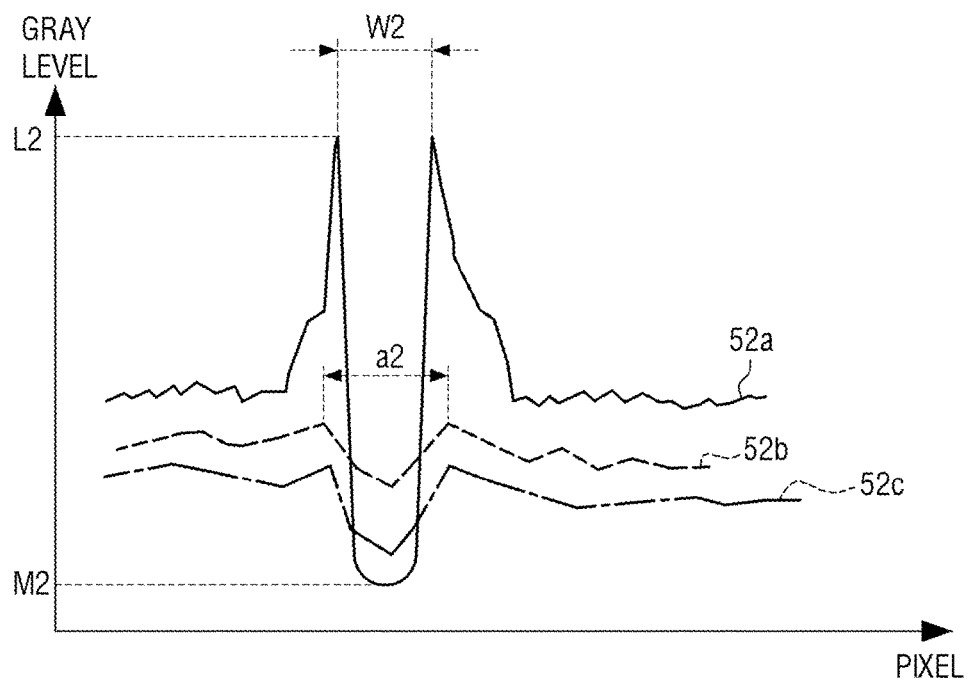
Figure 4C:
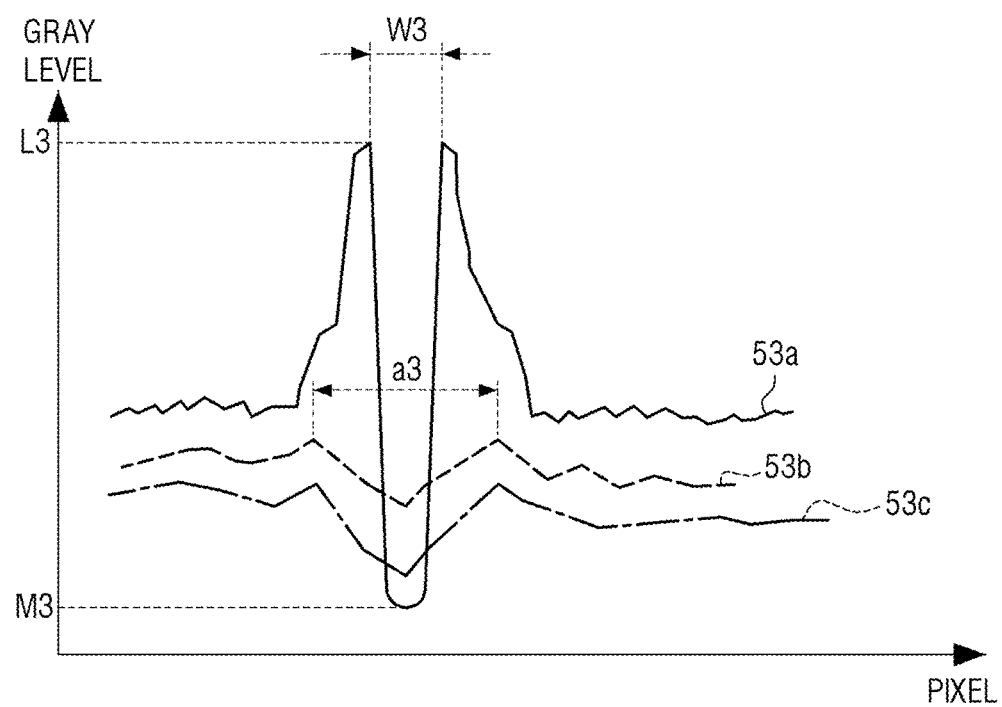

FIGS. 3A to 3C are cross-sectional views of the semiconductor device components as a measurement target of the system according to an exemplary implementation, and FIGS. 4A to 4C are graphs illustrating the gray level of the SEM image of the semiconductor device components of FIGS. 3A to 3C.

Hereinafter, the 3D profiling method of the semiconductor chip according to the exemplary implementation will be described with reference to FIGS. 2 and 3A to 3C.

First, the semiconductor devices having respective data associated with the plurality of different components are provided in (S100).

According to some exemplary implementations, the first to third semiconductor device components 101 to 103 having profiles different from each other may be provided. The first to third semiconductor device components 101 to 103 may have different depths (D1 to D3), different TCDs (T1 to T3), and different BCDs (B1 to B3). Although it is not illustrated, the angles formed by side walls and bottom surfaces of the first to third semiconductor device components 101 to 103 may be different from each other.

Next, the SEM images and the gray levels of the SEM images are generated in the plurality of semiconductor devices 101 to 103 (S110).

The SEM may irradiate the semiconductor devices 101 to 103 with electrons using different acceleration voltages. For example, the SEM may measure the semiconductor device component 101, using electrons irradiated by a first acceleration voltage 41a, electrons irradiated by a second acceleration voltage 42a, and electrons irradiated by a third acceleration voltage 43a.

In some exemplary implementations, the third acceleration voltage may be greater than the second acceleration voltage, and the second acceleration voltage may be greater than the first acceleration voltage.

The transmission capability of the electrons to the first semiconductor device 101 may vary, depending on the acceleration voltage of electrons emitted from the SEM.

Therefore, the electrons 41b may be emitted from the top surface of the first semiconductor device component 101 by the electrons 41a irradiated by the first acceleration voltage, and the electrons 42b may be emitted from the inside of the first semiconductor device component 101 by the electrons 42a irradiated by the second acceleration voltage. Further, the electrons 43b may be reflected from the bottom surface of the first semiconductor device component 101 by the electrons 43a irradiated by the third acceleration voltage.

In some exemplary implementations, the first acceleration voltage may be 0.8 KeV, the second acceleration voltage may be 10 KeV, and the third acceleration voltage may be 20 KeV.

In this way, the information of the different portions of the first semiconductor device component 101 may be measured by the electrons irradiated on to the semiconductor device through the different acceleration voltages. Thus, the gray level of the first semiconductor device component 101 measured by the electrons with the different transmission forces may contain different data corresponding to the plurality of different components of the first semiconductor device component 101.

Similarly, in the second and third semiconductor device components 102 and 103, when irradiating the electrons by the different acceleration voltages, the gray levels of second and third semiconductor device components 102, 103 may contain different data for the plurality of different components of the second and third semiconductor device components 102, 103.

Hereinafter, the description of the above exemplary implementation will be supplemented with reference to FIGS. 2 to 4C. As illustrated in FIG. 4A, the different gray level information is shown by electrons irradiated at the three acceleration voltages.

In some exemplary implementations, the first to third graphs 51a to 51c indicate the gray level of first semiconductor device component 101, the first graph 51a is a gray level of the first semiconductor device component 101 determined by the first acceleration voltage, the second graph 51b is a gray level of the first semiconductor device component 101 determined by the second acceleration voltage, and the third graph 51c is a gray level of the first semiconductor device component 101 determined by the third acceleration voltage.

Since the information of the top surface of the first semiconductor device component 101 may be measured by the first acceleration voltage, the first width W1 of graph 51a may contain the TCD information of the first semiconductor device component 101. Further, since the information of the bottom surface of the first semiconductor device component 101 may be measured by the third acceleration voltage, the fourth width a1 of graph 51c may contain the BCD information of the first semiconductor device component 101.

The gray level of the first semiconductor device component 101 measured by the second acceleration voltage, may contain thickness profile information of the of the first semiconductor device component 101.

Meanwhile, since the first graph 51a contains the data of the top surface of the first semiconductor device component 101, the information of the depth D1 of the semiconductor device component 101 may be expressed by a maximum value L1 and a minimum value M1 of the first graph of 51a.

Since the first graph 51a contains the information of the gray level generated by electrons emitted from the top surface of the first semiconductor device component 101, a level difference D1 between the top surface and the lower surface of the first semiconductor device component 101 may correspond to a difference (L1−M1) between the maximum value and the minimum value of the first graph 51a.

In this way, the plurality of different components, e.g., the data, such as the depth, the TCD and the BCD of the first semiconductor device component 101 may correspond to and be represented in the gray levels of the SEM image of the first semiconductor device component 101.

Similarly, as illustrated in FIG. 4B to FIG. 4C, data of the plurality of different components of the second and third semiconductor device components 102, 103 may be expressed by the gray levels 52a to 52c and 53a to 53c of the second to the third semiconductor device components 102, 103.

For example, the TCD (T2, T3) information of the second semiconductor device component 102 and the third semiconductor device component 103 may be expressed by the second width W2 and the third width W3, and the BCD (B2, B3) information of the second and third semiconductor device components 102, 103 may be expressed by the fifth width a2 and the sixth width a3.

In this way, the gray levels of the first to third semiconductor device components 101 to 103 and the plurality of different components may be correlated with each other. In the plurality of different components, correlation coefficients of the gray levels of the first to third semiconductor device components 101 to 103 may be different from each other.

Although the depth, the TCD and the BCD of the first to third semiconductor device components 101 to 103 have been described as an example of a plurality of components correlated with the first to third semiconductor device components 101 to 103, the present exemplary implementation is not to be limited thereto. The plurality of different components may contain any component as long as the component represents characteristics such as those of the first to third semiconductor device components 101 to 103.

Next, the PCA is performed on the gray levels of the images of the semiconductor devices to separate the principal component (S120).

Figure 5:
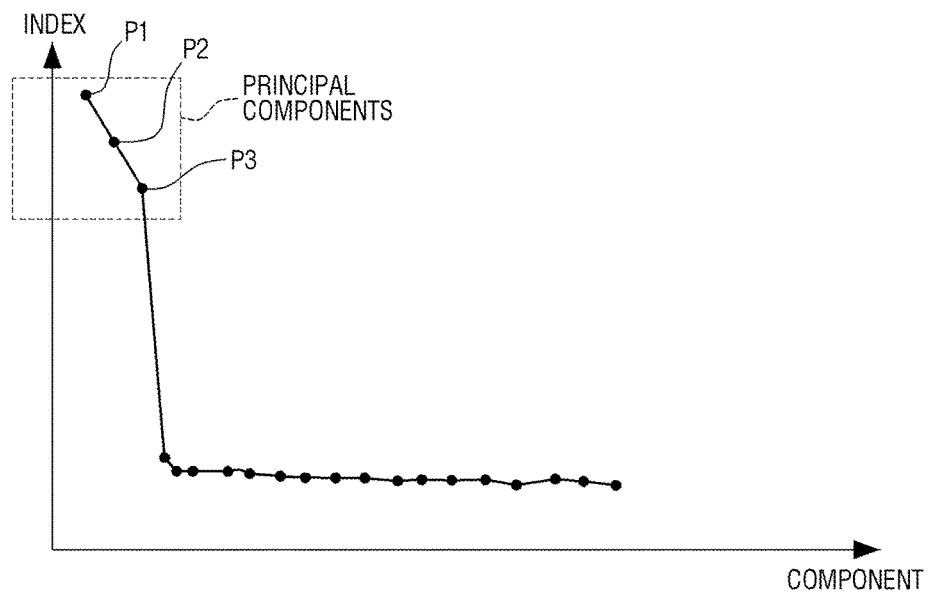
FIG. 5 is a graph illustrating principal components separated by PCA performed by the system according to the exemplary implementation.

FIG. 5 is a graph illustrating the principal components separated by the PCA performed by the system according to exemplary implementations.

As shown in FIG. 5, the plurality of different components may have correlation coefficients different from the gray level measured from the semiconductor device, and they may be expressed by the different index values as illustrated in FIG. 5.

For example, the gray levels measured from the semiconductor device may be expressed with respect to the m different components ($x_1, x_2, \ldots, x_m$), and the gray levels may be expressed by being correlated with $x_1, x_2, \ldots, x_m$.

Among the m different components, n (where, n may be smaller than or equal to m) components having the greatest correlation with the gray levels measured from the semiconductor device are defined as the principle components, and the remaining m-n components may be ignored.

In the 3D profiling system of the semiconductor chip according to an exemplary implementation, each time the components correlated with the gray level of the semiconductor device increase, the dimension of the data needed for the semiconductor gray levels to consider may increase. In the 3D profiling of the semiconductor chip using the computer system, an increase in the data dimension to be processed may inevitably cause an increase in processing time. Therefore, the components having a small correlation with the gray levels measured from the semiconductor device may be discriminated and removed, thereby reducing the processing time and the processing power of the 3D profiling.

Finally, by receiving the provision of actually measured values of the semiconductor device and by applying the multiple linear regression to the principal components based on the actually measured values, the 3D profiling may be completed.

The actually measured value of the semiconductor device may be obtained by measuring the surface measurements using a TEM image or AFM of the cross-section of the semiconductor device.

For example, when measuring the depth of the j semiconductor devices by the surface measurement using the TEM image or the AFM of the cross-section of the semiconductor device, this may be expressed as the following equation (1).

$$S = \sum_{k=1}^{j} \left( y_k - a_0 - \sum_{i=1}^{n} a_i x_i \right)^2 \qquad (1)$$

Here, S is the gray level of the semiconductor device measured from SEM, $y_k$ is the depth of the $k^{th}$ semiconductor device obtained by the actual measurement, $a_i$ is a correlation coefficient, and $a_0$ is a constant.

The correlation coefficients $a_0, a_1, a_2, \ldots, a_n$ may be calculated from the above formula to calculate a relational formula between the gray levels of the semiconductor device and the plurality of different components. The correlation coefficients of the plurality of different components may be different from one another.

Measurement of the depth of the j semiconductor devices may be replaced with the measurement of the depths of the different patterns in the same semiconductor device.

By configuring the relational formula between the gray levels and the plurality of different components in this way, it is possible to perform the three-dimensional structural analysis of the pattern in the semiconductor device. For example, the plurality of different SEM images requiring the measurement and the gray level of the SEM images are obtained, and after separating the principal components, by substituting the principal components into the relational formula, the values of each of the principle components may be predicted.

With the 3D profiling system of the semiconductor chip according to the exemplary implementation, it is possible to obtain three-dimensional structural information of the fine pattern in the semiconductor chip, using the SEM image capturing method that is a nondestructive method. Further, as compared to the TEM image capturing of the cross-section of the semiconductor chip or the surface measurement using the AFM probe, it is possible to perform a rapid structural analysis, using a statistical analysis of the SEM image and its gray level.

Figure 6:
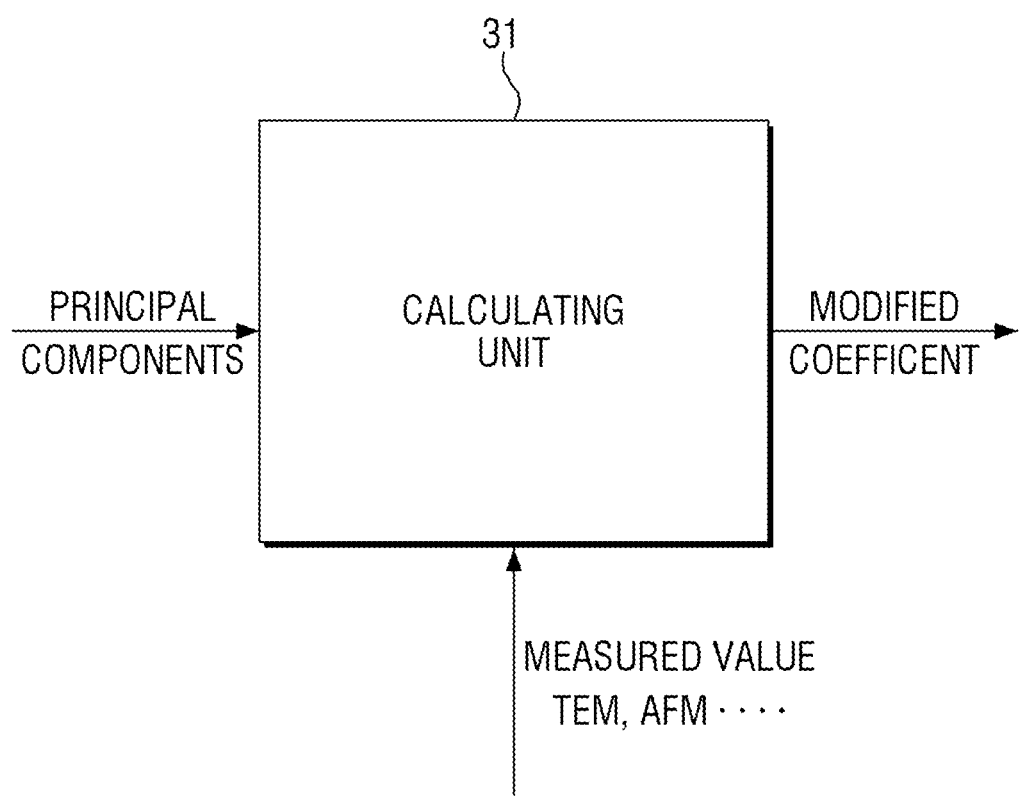
FIG. 6 is a block diagram illustrating another configuration of a calculation unit included in the system according to the exemplary implementation.
Figure 7:
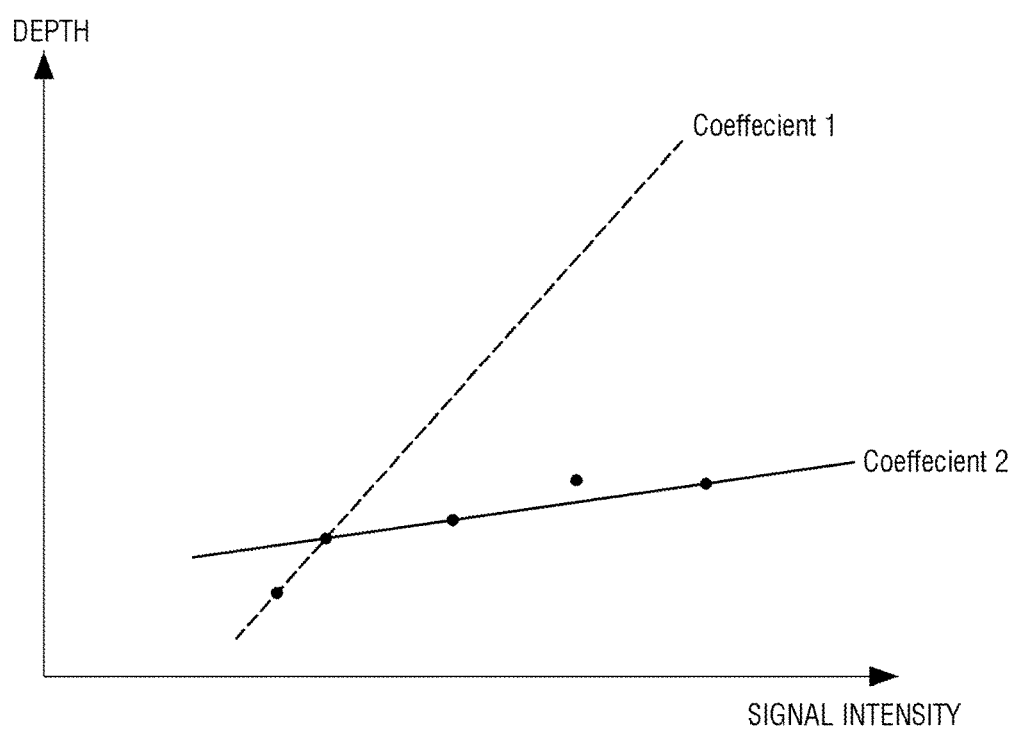
FIG. 7 is a graph illustrating the correction of correlation coefficients performed by the calculation unit of FIG. 6.

FIG. 6 is a block diagram illustrating another configuration of a calculation unit included in the system according to exemplary implementations, and FIG. 7 is a graph illustrating the correction of the correlation coefficients performed by the calculation unit of FIG. 6.

As shown in FIGS. 6 and 7, the calculation unit 31 may receive the provision of the actually measured value of the target semiconductor device, and may correct the relational formula between the gray level and the principle components of the SEM image of the semiconductor device previously completed using multiple linear regression.

The relational formula between the gray level and the principal components measured from the semiconductor device previously acquired by the statistical method may include certain errors. Therefore, a modified coefficient is generated by receiving the the gray level data and the plurality of different components of the new target semiconductor device, and a new relational formula may be generated on the basis of the modified coefficient.

The calculation unit 31 may generate the new relational formula using the measured values of the new target semiconductor device, by machine learning.

FIG. 7 illustrates a coefficient correction between the depth of the semiconductor device and the intensity of the gray level as an example. For convenience of explanation, although other components are not illustrated, it will be obvious to those skilled in the art that the correlation coefficients of the plurality of different components may be corrected in the same way.

Figure 8:
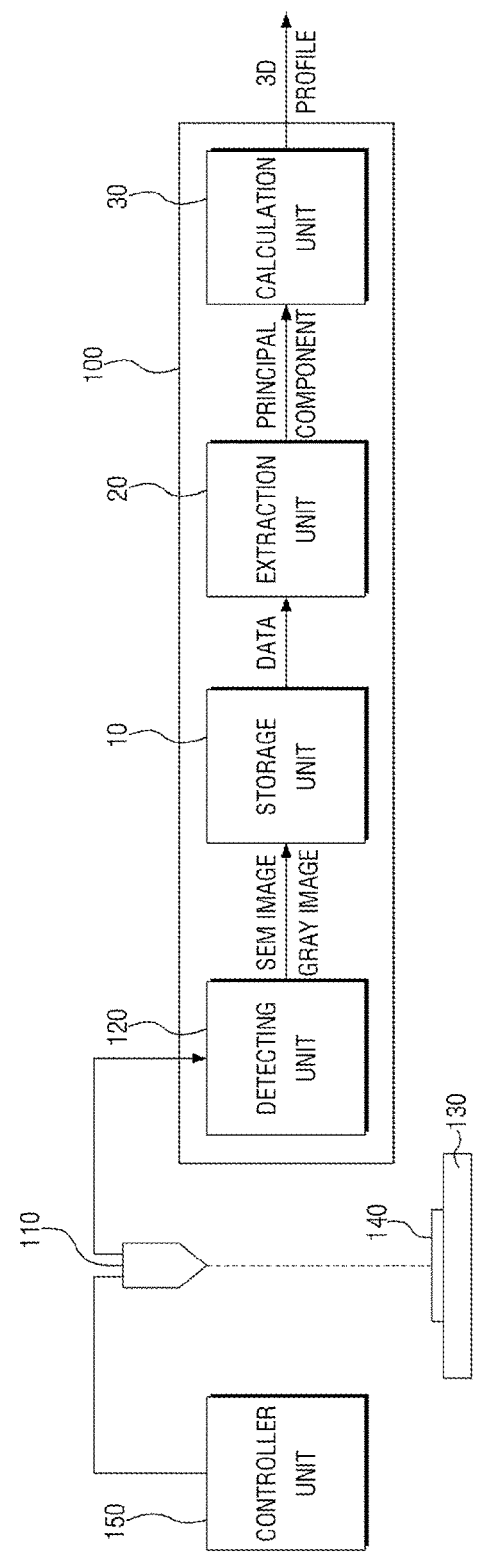

FIG. 8 is a block diagram of the 3D profiling system of the semiconductor chip according to another exemplary implementation.

The 3D profiling system 2 of the semiconductor chip may further include an electron irradiation unit 110, a detecting unit 120 and a stage 130 with the semiconductor chip mounted thereon.

Although the electron irradiation unit 110 may further include an electron beam source for generating an electron beam, an electromagnetic lens for focusing the electron beam and the like, the present exemplary implementation is not limited thereto.

The detecting unit 120 may detect secondary electrons (SE) emitted through the electronic scanning of the electron irradiation unit 110 or backscattered electron (BSE) to obtain the SEM image and the gray level of the SEM image of the semiconductor device 140.

The gray levels of the SEM images of the different regions in the semiconductor device may be determined by the detected secondary and/or backscattered electrons.

The detecting unit 120 may acquire the SEM image of the semiconductor device 140 and the gray level of the SEM image and may provide them to the storage unit 10. The storage unit 10 may be a volatile memory capable of temporarily storing the provided image or gray level. Although the storage unit 10 may be a nonvolatile memory, a magnetic tape or a hard disk capable of semi-permanently storing the provided images and gray level, the present exemplary implementation is not limited thereto.

In preparation for measurement, semiconductor device 140 may be mounted on the stage 130. If necessary, the plurality of semiconductor devices 140 may be mounted on the stage 130. If necessary, the stage 130 may be inclined at a predetermined angle so that the electron beam is irradiated, while forming a predetermined angle with the semiconductor device 140.

The control unit 150 may control the operation of the electron irradiation unit 110. For example, the control unit 150 may control the operations such as movement and tilting of the electron irradiation unit 110.

Figure 9:
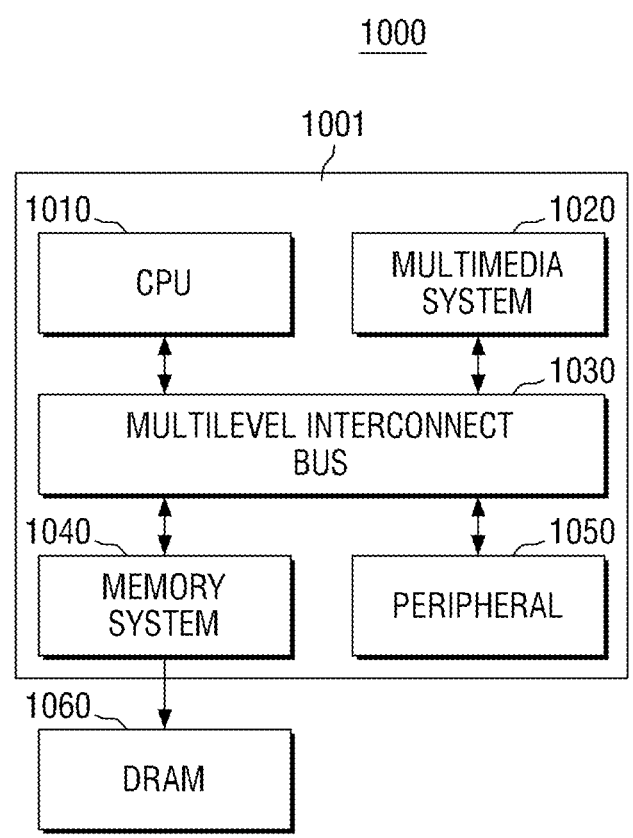
FIG. 9 is a block diagram of a SoC that includes a semiconductor chip that can be measured by the exemplary implementation.

FIG. 9 is a block diagram of a SoC (system on a chip) including the semiconductor device that can be measured by the present exemplary implementation.

As shown in FIG. 9, the SoC 1000 may include an application processor 1001 and a DRAM 1060.

The application processor 1001 may include a central processing unit 1010, a multimedia system 1020, a multilevel connection bus 1030, a memory system 1040 and a peripheral circuit 1050.

The central processing unit 1010 may perform the operations required for driving the SoC system 1000. In some exemplary implementations, the central processing unit 1010 may be constituted by a multi-core environment that includes multiple cores.

The multimedia system 1020 may be used to perform various multimedia functions in the SoC system 1000. The multimedia system 1020 may include a 3D engine module, a video codec, a display system, a camera system, a post-processor and the like.

The multilevel connection bus 1030 may be used to perform the mutual data communication of the central processing unit 1010, the multimedia system 1020, the memory system 1040 and the peripheral circuit 1050. In some exemplary implementations, the multilevel connection bus 1030 may have a multilayer structure. Specifically, as an example of the multilevel connection bus 1030, but not limited thereto, a multilayer advanced high-performance bus (AHB) or a multilayer advanced extensible interface (AXI) may be used.

The memory system 1040 may provide an environment needed for the application processor 1001 to be connected to an external memory (e.g., the DRAM 1060) and operate at high speed. In some exemplary implementations, the memory system 1040 may include a separate controller (e.g., a DRAM controller) needed to control the external memory (e.g., the DRAM 1060).

The peripheral circuit 1050 may provide an environment needed for the SoC system 1000 to smoothly connect to an external device (e.g., a main board). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001. In some exemplary implementations, the DRAM 1060 may be disposed outside the application processor 1001 as illustrated in FIG. 9. Specifically, the DRAM 1060 may be packaged with the application processor 1001 in the form of a package on package (PoP) system.

At least one of the constituents of such a SoC 1000 may adopt a semiconductor device in which the principal components are measured using the 3D profiling system of the semiconductor device according to the above-described exemplary implementations.

Figure 10:
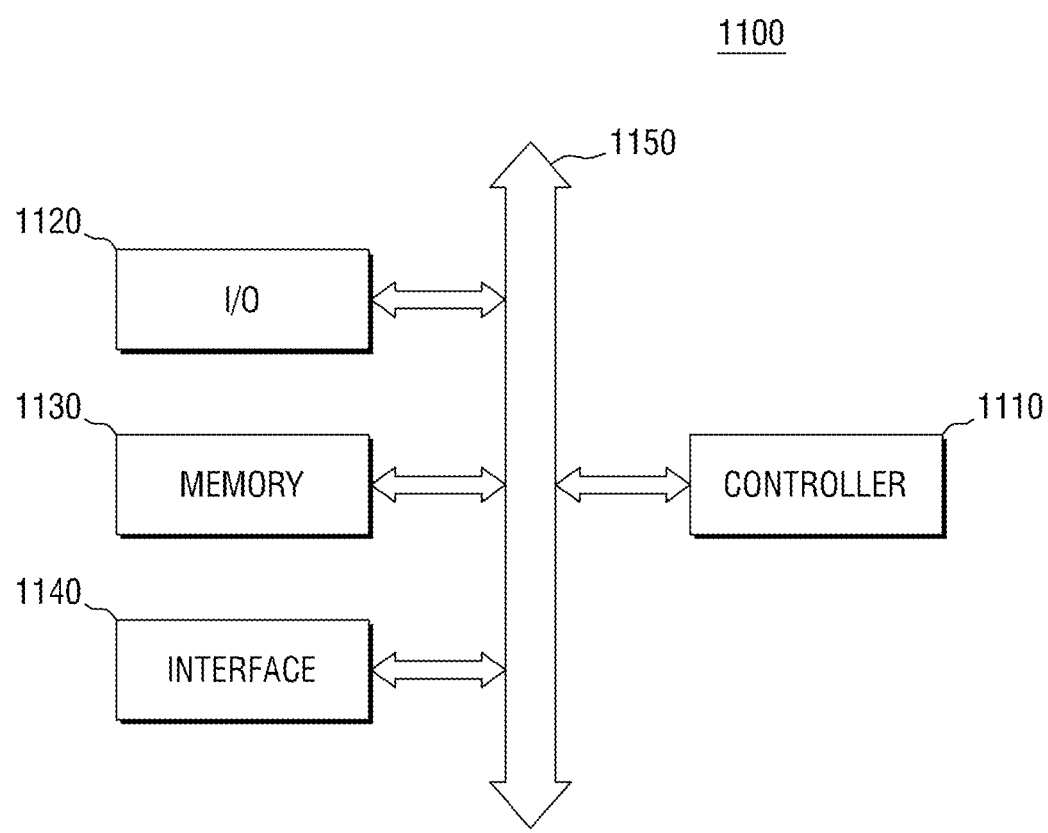
FIG. 10 is a block diagram of an electronic system including a semiconductor chip and a SoC in which the important components are measured using the 3D profiling system of the semiconductor chip according to the exemplary implementation.

FIG. 10 is a block diagram of an electronic system including the semiconductor chip in which the principal components are measured using the 3D profiling system according to the exemplary implementations.

As shown in FIG. 10, an electronic system 1100 according to the exemplary implementations may include a controller 1110, an input/output (I/O) device 1120, a memory device 1130, an interface 1140 and a bus 1150. The controller 1110, the I/O device 1120, the memory device 1130 and/or the interface 1140 may be connected to one another through the bus 1150. The bus 1150 corresponds to a path through which the data are moved.

The controller 1110 may include at least one of a microprocessor, a digital signal processor, a microcontroller and logic devices capable of performing functions similar to these devices. The I/O device 1120 may include a keypad, a keyboard, a display device and the like. The memory device 1130 may store data and/or commands. The interface 1140 may serve to transmit data to or receive data from a communication network. The interface 1140 may be a wired or wireless interface. For example, the interface 1140 may include an antenna or a wired or wireless transceiver.

Although it is not illustrated, the electronic system 1100 may also include a high-speed DRAM or SRAM, as an operating memory for improving the operation of the controller 1110.

Further, the semiconductor device according to the above-described exemplary implementations may be provided in the memory device 1130 or may be provided as a part of the controller 1110 and the input/output (I/O) 1120.

The electronic system 1100 may be applied to a personal digital assistant (PDA), a portable computer, a web tablet, a wireless phone, a mobile phone, a digital music player, a memory card or all types of electronic products capable of transmitting or receiving information in a wireless environment.

Figure 11:
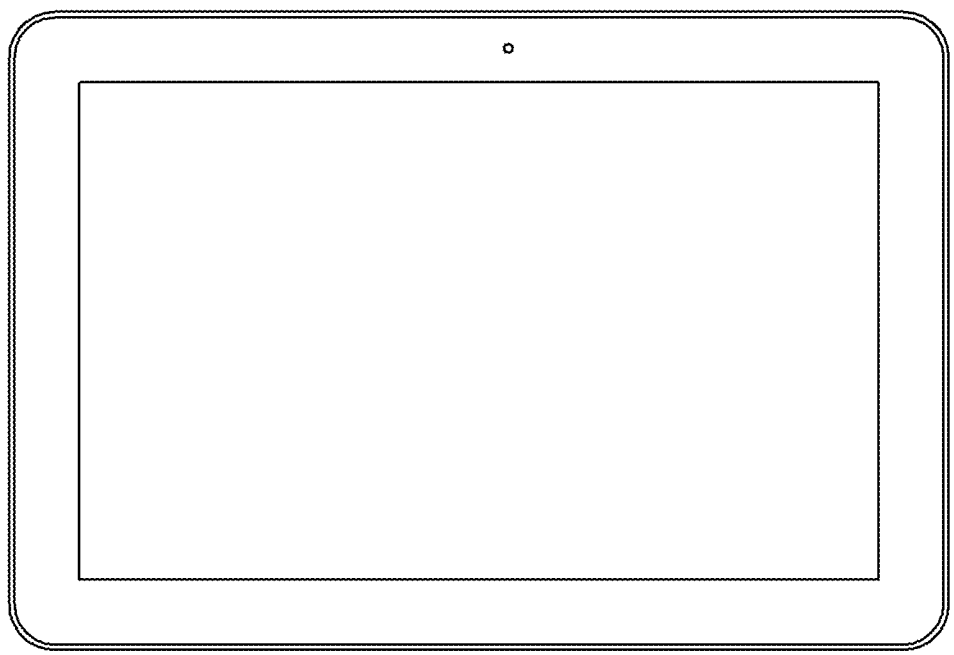
FIGS. 11 to 13 are exemplary semiconductor systems to which a semiconductor chip measured in accordance with the exemplary implementation is applicable.
Figure 12:
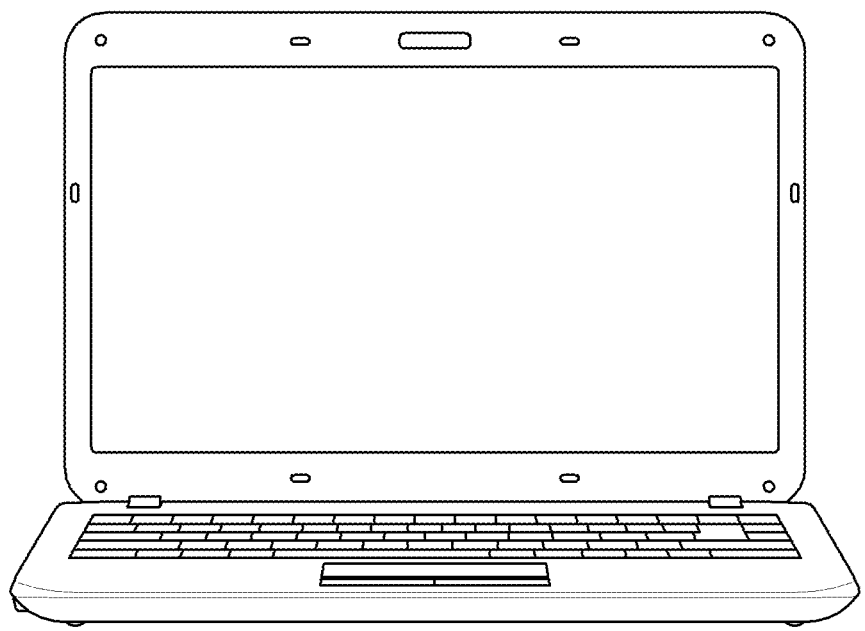
Figure 13:
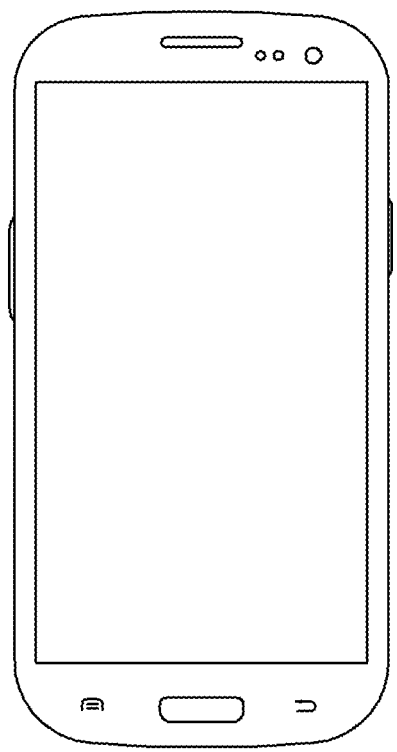

FIGS. 11 through 13 are diagrams illustrating examples of a semiconductor system to which the semiconductor chip measured according to some exemplary implementations can be applied.

FIG. 11 illustrates a tablet personal computer (PC) 1200, FIG. 12 illustrates a notebook computer 1300, and FIG. 13 illustrates a smart phone 1400. At least one of the processors according to the embodiments of the present inventive concept may be used in the tablet PC 1200, the notebook computer 1300, the smart phone 1400 and the like.

Further, it is obvious to a person skilled in the art that the semiconductor device according to some exemplary implementations may also be applied to other IC devices other than those set forth herein.

For example, while only the tablet PC 1200, the notebook computer 1300 and the smart phone 1400 have been described above as examples of the semiconductor system according to this exemplary implementation, the examples of the semiconductor system according to the exemplary implementation are not limited thereto.

In some exemplary implementations, the semiconductor system may be provided as a computer, an Ultra Mobile PC (UMPC), a work station, a net-book computer, a personal digital assistant (PDA), a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While the herein described subject matter has been particularly illustrated and described with reference to exemplary implementations thereof, it will be understood by those of ordinary skill in the art that various changes in form and detail may be made therein without departing from the spirit and scope of the present inventive concepts as defined by the following claims. The exemplary implementations should be considered in a descriptive sense only and not for purposes of limitation.

The foregoing is illustrative of the present exemplary implementations and is not to be construed as limiting thereof. Although a few exemplary implementations have been described, those skilled in the art will readily appreciate that many modifications are possible in the exemplary implementations without materially departing from the novel teachings and advantages of the present inventive concepts as defined in the appended claims. Accordingly, all such modifications are intended to be included within the scope of the present inventive concept as defined in the claims. Therefore, it is to be understood that the foregoing specific exemplary implementations disclosed herein are not to be construed as limited, and that modifications to the disclosed exemplary implementations, as well as other exemplary implementations, are intended to be included within the scope of the appended claims.

What is claimed is:

1. A 3D profiling system of a semiconductor chip comprising:
   a storage unit that receives scanning electron microscope (SEM) images of a plurality of semiconductor devices having respective data with respect to a plurality of different components from an SEM and gray levels of the SEM images;
   an extraction circuit that performs principal component analysis (PCA) on the gray levels of the SEM images and separates principal components among the plurality of different components; and
   a calculation circuit that receives measured values of the plurality of semiconductor devices related to shapes of the plurality of semiconductor devices, and applies a multiple linear regression to the principal components based on the measured values to complete a 3D profile of the semiconductor chip.

2. The system of claim 1, wherein application of the multiple linear regression to the principal components by the calculation circuit comprises a relational formula that includes a correlation coefficient between the gray levels of the SEM images and the principal components.

3. The system of claim 2, wherein the correlation coefficients between the gray levels and the principal components differ from one another.

4. The system of claim 2, wherein the relational formula comprises $$S = \sum_{k=1}^{j} \left( y_k - a_0 - \sum_{i=1}^{n} a_i x_i \right)^2$$

wherein S is the gray level, $y_k$ is a component of a $k^{th}$ semiconductor device obtained by actual measurement, $a_i$ is a correlation coefficient, $x_i$ is the principal component and $a_0$ is a constant.

5. The system of claim 2, wherein the calculation circuit receives provision of the measured value of a target semiconductor device, and corrects the correlation coefficient between the gray level of the SEM images and the principal components.

6. The system of claim 1, wherein the plurality of different components comprises at least one of a depth of the semiconductor device, a top critical dimension (TCD), a bottom critical dimension (BCD) and a profile angle of opposing side walls.

7. The system of claim 1, wherein each of the SEM images comprise a first image of the semiconductor device acquired by a first acceleration voltage, and a second image of the semiconductor device acquired by a second acceleration voltage different from the first acceleration voltage.

8. The system of claim 7, wherein the first image comprises data of a first height of the semiconductor device, and the second image comprises data of a second height different from the first height of the semiconductor device.

9. The system of claim 1, wherein the plurality of semiconductor devices comprises a first semiconductor device and a second semiconductor device, and
the data of the plurality of different components of the first semiconductor device are different from the data of the plurality of different components of the second semiconductor device.

10. The system of claim 1, wherein the separation of the principal components by the extraction circuit comprises separation of the components in which a correlation coefficient with the gray level is a predetermined value among the plurality of different components.

11. The system of claim 1, wherein the SEM images comprises images of secondary electron (SE) or backscattered electron (BSE).

12. A 3D profiling system of a semiconductor chip comprising:
an electron irradiation unit that irradiates an electron beam toward a plurality of semiconductor devices having respective data for a plurality of different components;
a stage that supports the semiconductor devices;
a detecting circuit that detects intensity of the electrons emitted from the semiconductor devices to generate a gray level of an SEM image;
an extraction circuit that performs PCA on the gray level of the SEM image to separate principal components from among the plurality of different components; and
a calculation circuit that receives provision of measured values of the plurality of semiconductor devices related to shapes of the plurality of semiconductor devices, and applies a multiple linear regression to the principal components based on the measured values to complete a 3D profile of the semiconductor chip.

13. The system of claim 12, further comprising:
a storage unit that receives provision of the gray level of the SEM image, stores the gray level and provides the gray level to the extraction circuit.

14. The system of claim 12, wherein the detecting circuit detects one of secondary electrons (SE) or backscattered electrons (BSE).

15. The system of claim 12, wherein the semiconductor chip comprises a first region and a second region, and
the detecting circuit detects the gray level of secondary electrons (SE) of the first region and detects the gray level of backscattered electrons (BSE) of the second region.

16. A 3D profiling system of a semiconductor chip comprising:
an electron irradiation unit that irradiates an electron beam toward each of a plurality of semiconductor devices having respective data for a plurality of different components, said electron beam having a first electron beam intensity for obtaining 3D profiling information relating to a top surface of each of the plurality of semiconductor devices and having a second electron beam intensity for obtaining 3D profiling information relating to a bottom surface of each of the plurality of semiconductor devices;
a detecting circuit that detects the intensity of the electrons emitted from the plurality of semiconductor devices to generate gray levels of SEM images reflecting the 3D profiling information relating to the top and bottom surfaces of each of the plurality of semiconductor devices;
an extraction circuit that performs PCA on the gray levels of the SEM images to separate principal components from among the plurality of different components for each of the plurality of semiconductor devices; and
a calculation circuit that receives measured values for each of the plurality of the semiconductor devices related to shape of each of the plurality of semiconductor devices and applies a multiple linear regression analysis to the principal components of to complete a 3D profile of the semiconductor chip.

17. The system of claim 16, wherein said first and second electron beam intensities are used to obtain 3D profile information relating to a depth of each of the plurality of different components.

18. The system of claim 16, further including a third electron beam intensity for obtaining 3D profiling information relating to a width of each of the plurality of different components.

19. The system of claim 16, wherein the differing electron beam intensities are differing electron acceleration voltages.

20. The system of claim 16, further comprising:
a storage unit that receives and stores the gray levels of the SEM images, and provides the gray levels of the SEM images to the extraction circuit.

* * * * *